(12) United States Patent
Branscome

(10) Patent No.: US 9,553,605 B2
(45) Date of Patent: Jan. 24, 2017

(54) EFFICIENT DATA ENCODING

(71) Applicant: Teradata US, Inc., Dayton, OH (US)

(72) Inventor: Jeremy L. Branscome, Santa Clara, CA (US)

(73) Assignee: Teradata US, Inc., Dayton, OH (US)

( * ) Notice: Subject to any disclaimer, the term of this patent is extended or adjusted under 35 U.S.C. 154(b) by 0 days.

(21) Appl. No.: 14/977,712

(22) Filed: Dec. 22, 2015

(65) Prior Publication Data

US 2016/0191075 A1    Jun. 30, 2016

Related U.S. Application Data

(60) Provisional application No. 62/098,459, filed on Dec. 31, 2014.

(51) Int. Cl.
H03M 7/40 (2006.01)
H03M 7/30 (2006.01)

(52) U.S. Cl.
CPC .......... *H03M 7/40* (2013.01); *H03M 7/30* (2013.01); *H03M 7/3066* (2013.01)

(58) Field of Classification Search
CPC ......... H03M 7/40; H03M 7/3066; H03M 7/30
USPC ...................................... 341/67, 79
See application file for complete search history.

(56) References Cited

U.S. PATENT DOCUMENTS

| | | | |
|---|---|---|---|
| 6,518,895 B1 | 2/2003 | Weiss et al. | |
| 6,633,242 B2 | 10/2003 | Brown | |
| 7,443,841 B2 * | 10/2008 | Davis | H04L 45/00 370/352 |
| 7,852,851 B2 * | 12/2010 | Pong | H04L 29/12801 370/389 |
| 9,060,001 B2 * | 6/2015 | Luong | H04L 67/1065 |

* cited by examiner

*Primary Examiner* — Brian Young
(74) *Attorney, Agent, or Firm* — Schwegman Lundberg & Woessner, P.A.

(57) ABSTRACT

A source data set is processed to produce a symbol table and a distribution without using a tree construct or any tree-related processing. The symbol table and the distribution outputted for encoding the data set and decoding encoded versions of the data set.

18 Claims, 4 Drawing Sheets

* Input symbols are non-unique, uncompressed input symbols $x_i$.
* Each distinct symbol $s_i$ is sorted by its frequency in Symbol Frequence Sieve
* Actual build process does not begin until all uncompressed inputs received Code Generation

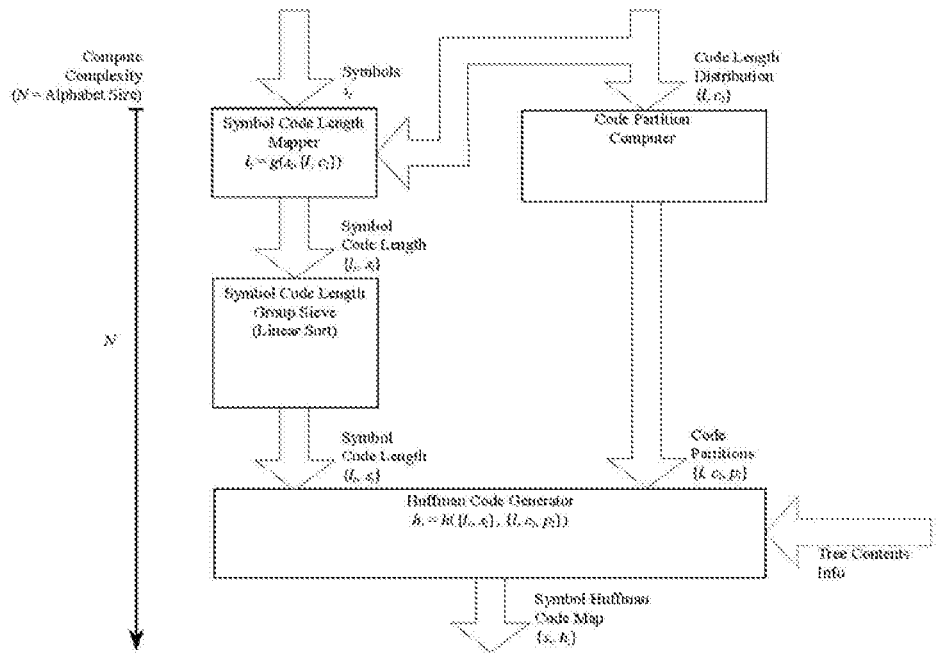

FIG. 3

* Input symbols $\{s_i, f_i\}$ assumed sorted by frequency, i.e. $f_i \le f_{i+1}$
* $g$ maps a symbol to its appropriate length, given Code Length Distribution
* $h$ maps a symbol of given length to its Huffman code, given Code Partitions
* Preferred implementation does not require or use Tree interface
  (Adheres to RFC 1951 section 3.2 requirements)
* Alternative implementation may receive Tree root as $T$, in lieu of Code Length Distribution,
  where Huffman Code Generator is *only* block implemented, with
  $h_i = h(s_i, T)$
  i.e. $h$ maps a symbol to its Huffman code utilizing Tree interface (complexity $\to N \log N$)

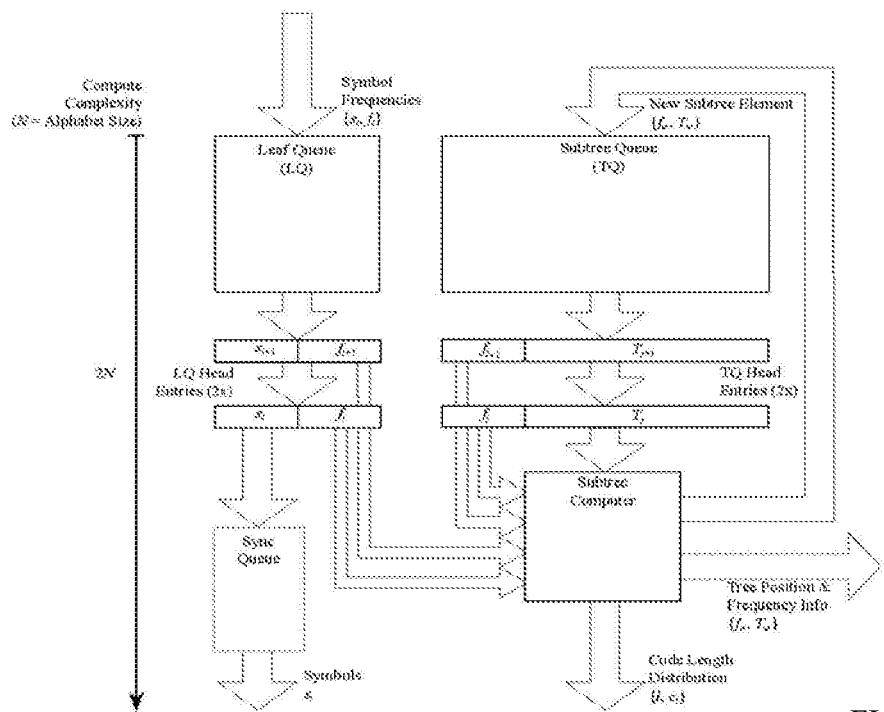

FIG. 4

* Input symbols $\{s_i, f_i\}$ assumed sorted by frequency, i.e. $f_i < f_{i+1}$
* Preferred implementation $T_j$ is counter array (histogram) up to $M$ buckets, each counter position mapping code length $l$ to code count $c_l$ (in subtree)

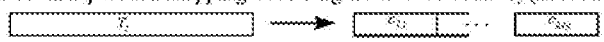

* Preferred implementation does not require or use Tree Position... interface
* Alternative implementations may let $T_j$ represent either a Tree leaf (symbol); or a pair of Tree element references (subtree), as a flexible data representation (intrinsic encoding may differentiate)

* Alternative implementations may output the final Tree root as $T$, instead of Code Length Distribution
* Sync Queue is incidental to implementation

EFFICIENT DATA ENCODING

RELATED APPLICATIONS

The present disclosure is a non-provisional of, claims priority to, and is co-pending with U.S. Provisional Ser. No. 62/098,459 entitled "Efficient Data Encoding," filed on Dec. 31, 2014; the disclosure of which is incorporated by reference in its entirety herein and below.

BACKGROUND

Conventional Huffman encoding algorithms involve constant sorting and scanning of the data. It is very costly in terms of computation time and hardware real estate.

Moreover, the Huffman encoding algorithm also needs to build and maintain a binary tree as coding. This involves a pointer-chasing process. Pointer chasing is very computation-costly.

BRIEF DESCRIPTION OF THE DRAWINGS

FIG. 3 is a diagram depicting a flow diagram of code generation, according to an example embodiment.

FIG. 4 is a diagram depicting a flow diagram of code length determination, according to an example embodiment.

DETAILED DESCRIPTION

Various embodiments depicted herein are implemented as one or more software modules, which are programmed within memory and/or non-transitory computer-readable storage media and executed on one or more processing devices (having memory, storage, network connections, one or more processors, etc.).

The embodiments herein provide, among other things:
A) more efficient for hardware implementation and execution
  i.) exploiting more (pipelined- and data-) parallelism; and
  ii.) exhibiting reduced compute complexity (e.g. the tree is only implicit); and
B) can achieve both
  i.) the Huffman coding semantics; plus
  ii.) the coding scheme of, e.g., the Deflate algorithm (RFC 1951 section 3.2), which itself utilizes Huffman.

Figure 1:
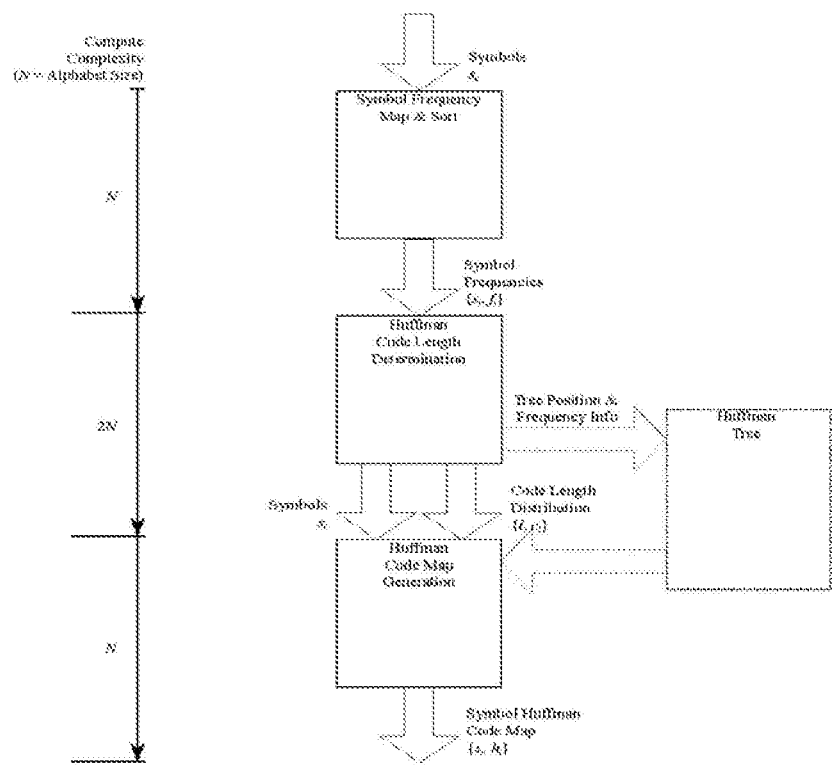
FIG. 1 is diagram depicting a flow diagram of efficient data encoding, according to an example embodiment.
Figure 2:
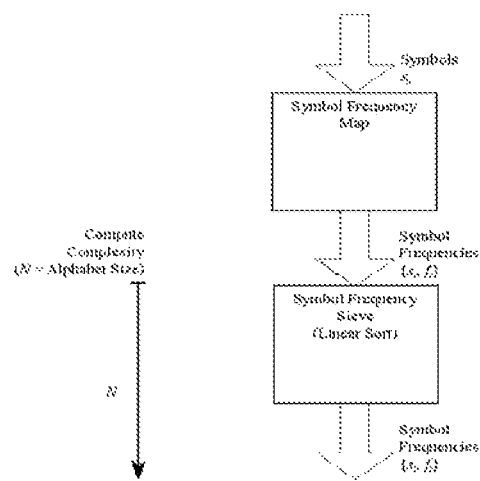
FIG. 2 is a diagram depicting a flow diagram of symbol frequency determination and sorting, according to an example embodiment.

With reference to the FIGS. 1-4, consider the following example, illustrating operation of various embodiments presented herein.

Consider an Alphabet: A, B, C, D (assume 8-bit ASCII is uncompressed symbol space).

Input Text: "DBCBABAB" (8*8=64 bits)

Symbol Frequencies (Unordered—Arbitrary) $\{s_i, f_i\}=\{\{A,2\}, \{B,4\}, \{C,1\}, \{D,1\}\}$ (Two As, four Bs, one C, one D).

Symbol Frequencies (Sorted by frequency) $\{s_i,f_i\}=\{\{D, 1\}, \{C,1\}, \{A,2\}, \{B,4\}\}$ (symbol order within a frequency group is arbitrary, but frequencies increase).

Symbols (from Code Length Determination) $\{s_i\}=\{D, C, A, B\}$ (frequencies not needed here anymore, symbols in same order as sorted $\{s_i,f_i\}$).

Code Length Distribution $\{l,c_i\}=\{\{1,1\}, \{2,1\}, \{3,2\}\}$ (i.e. one 1-bit code, one 2-bit code, and two 3-bit codes).

Symbol Code Length (from SCL Mapper) $\{l_i,s_i\}=\{\{3,D\}, \{3,C\}, \{2,A\}, \{1,B\}\}$ (e.g. associated sequentially, counted off by order of occurrence vis-a-vis CLD above and applying rule that least frequent symbols get longest codes, proceeding to most frequent symbols getting shortest codes).

The Code Partitions can be computed by way of RFC 1951 section 3.2.2 code (algorithm #2), (i.e. more than one "tree" can be used to encode this, meaning one could find alternative codes, too). But this is the encoding form imposed by RFC 1951, such that the results can be consistent and more easily inverted. The binary Huffman codes below are represented with underlining:

Code Partitions $\{l, c_i, p_i\}=\{\{1, 1, \underline{0}\}, \{2, 1, \underline{10}\}, \{3, 2, \underline{110}\}\}$ (So the 1-bit code starts at $\underline{0}$, 2-bit code at $\underline{10}$, and the 3-bit codes start at $\underline{110}$).

Symbol Code Length (Sorted by l,s) $\{l_i,s_i\}=\{\{1,B\}, \{2,A\}, \{3,C\}, \{3,D\}\}$ (Note the C will precede D within 3-bit group, which is lexicographical ordering requirement of RFC 1951, imposed by Symbol Code Length Sieve).

Finally, given $\{l_i,s_i\}$ and $\{l, c_i, p_i\}$, the Huffman Code Generator, in accordance with RFC 1951 3.2.2 (equivalent variation of algorithm #3) will generate codes within the code groups—again not the only way to do it:

| $s_i$ | $h_i$ | |
|---|---|---|
| B | 0 | (B maps to $p_1$ from $\{1,c_1,p_1\}$ of $\{l,c_i,p_i\}$) |
| A | 10 | (A maps to $p_2$ from $\{2,c_2,p_2\}$ of $\{l,c_i,p_i\}$) |
| C | 110 | (C maps to $p_3$, since C is ordered before D in the sorted $\{l_i,s_i\}$) |
| D | 111 | (D is mapped to $p_3$ + 1, by RFC 1951 scheme applying to additional symbols belonging to the same code length group) |

This last mapping egresses in some order, e.g. order of $\{l_i,s_i\}$, but becomes a static mapping; so order really no longer matters. The mapping is stored in a structure, referenced by original alphabet symbol space (ASCII, UNICODE, etc.) to get the associated Huffman code. So the original uncompressed input is mapped symbol by symbol using the above static mapping:

Input Text a Final Compressed Output

"DBCBABAB" à $\underline{111}$, $\underline{0}$, $\underline{110}$, $\underline{0}$, $\underline{10}$, $\underline{0}$, $\underline{10}$, $\underline{0}$ (14 bits instead of 64)

NOTE 1: The $\{s_i,h_i\}$ mapping doesn't show it, but the bit length of the code is actually included there (i.e., technically it's $\{s_i, h_i, l_i\}$) so that we can control how the "bit pointer" moves as we concatenate the final codes together.

NOTE 2: Also, the input alphabet may include other non-text symbols (see RFC 1951 3.2.5), which extend beyond typical 8-bit ASCII text and include length and distance codes, etc. These may appear as byproducts of a pre-Huffman phase of, e.g., the RFC 1951 DEFLATE scheme, utilized to improve compression. The techniques herein apply to compress such codes in the same manner—just the input alphabet is different.

The final goal of the "Subtree (Histogram) Computer" (SHC) is to provide, in some form, information regarding the anticipated compressed encodings. In some implementations this information could be in the form of a tree representation encoding not only code dimensions (lengths), but exact code values.

In an example implementation, a literal tree representation is obviated in favor of determining a distribution of code lengths, sufficient to characterize the code space for application of additional code construction schemes. This approach, indeed, meets the semantics to apply techniques of, e.g., the DEFLATE compression specification (RFC 1951) to finalize the code mapping (applied during Code Generation). Important to note is that use of the term "Huffman code" throughout is intended in the most general sense, to reference the general class of prefix codes, not limited to what may be generated by what may be considered the Huffman Algorithm. Also, although the term "tree" is often used, it is implementation-dependent as to whether this is a physical or logical form.

At the beginning of an SHC encoding process, the LQ and TQ are empty. The LQ fills with the symbol-to-frequency mapping $\{s_i, f_i\}$, emitted from the "Symbol Frequency Map & Sort" (SFMS) phase, in the form of e.g., tuples of data. The symbols are unique and are a subset of the source alphabet used in representing the uncompressed input, while the associated frequency represents the number of occurrences of the symbol therein. These mappings will have been sorted in the order of increasing frequency, where any symbol having zero frequency may be removed from consideration at any point.

The SHC operates as long as there are any elements in either the LQ or TQ, inclusively. The overall operation particularly involves repeated evaluation cycles, each evaluating at most 4 queue entries: the up to 2 head-most entries of both the LQ and TQ, ($LQ_i$, $LQ_{i+1}$, $TQ_j$, and $TQ_{j+1}$), provided they exist. Any implementation of the SHC may (actually must) utilize synchronization techniques within itself and between the SFMS to ensure that as many of these at most 4 entries will be available for consideration before beginning an evaluation cycle, thus preventing any physical race conditions. For example, if an implementation were pipelined such that symbol-to-frequency mappings were still arriving in time as the SHC contemplates beginning a new evaluation cycle, with the LQ containing less than 2 items, there would be a protocol in place for understanding that the (upstream) SFMS phase has more symbols to send; and the SHC would wait to receive sufficient symbols before beginning the evaluation cycle. Such a protocol might be, e.g., an expectation that the SFMS will send a separate, unique signal following the final $\{s_i, f_i\}$ output.

An SHC evaluation cycle first involves identifying among the up to 4 candidate queue entries the 2 entries exhibiting a particular property. In an embodiment, the desirable property is for the 2 entries of least frequency. If there are ties among existing frequency values (e.g. $LQ \cdot f_{i+1} = TQ \cdot f_j$) a priority policy may be employed, whereby one queue would always be chosen over the other (e.g. $B = LQ_{i+1}$ instead of any TQ entry, if there is a tie). Whatever the policies employed, the chosen queue entries are removed from their respective queues and, for the sake of the following concept description, labeled A and B. In a given evaluation cycle there may be 2 chosen from a single queue, or 1 chosen from each, or only 1 chosen from 1 queue, in the event there is only a single queue element remaining to process. When only 1 element is chosen, that element is conceptually labeled A, with B considered to be non-existent and disqualified from participation.

The ultimate purpose of any SHC evaluation cycle is to produce a new element, $\{f_w, T_w\}$, for either pushing to the tail of the TQ or emitting as a final result. The latter case occurs when at the end of an evaluation cycle both the LQ and TQ are empty (i.e. the 1 or 2 remaining entries have been removed from their respective queues) and no additional symbols are expected from the SFMS. In either case, however, the new $\{f_w, T_w\}$ element must be computed, which is discussed next in terms of A and B.

The SHC in its evaluation cycle, after choosing A and B (if B exists), will consider the origin queue of A and B to begin forming the new element $\{f_w, T_w\}$. The general process involves computing a frequency, $f_w$, and a subtree node, $T_w$, whose exact composition may vary by implementation.

In an embodiment, the implementation, $T_w$ is composed of a vector of M counters $\{c_{i,w}\} = \{c_{1,w}, c_{2,w}, \ldots, c_{M,w}\}$, where each counter represents the number of codes of length i visible to the subtree node $T_w$. Important to note regarding the M counters is that the M-th counter may be used to capture codes of any length M or larger. For example, in an implementation which serves within DEFLATE compression, M may be 16, with the 16-th counter representing the number of codes of length 16 bits or more. In alternative implementations, $T_w$ may be in the form of either a symbol or references to up to 2 dependent subtree nodes in a tree representation. Such alternative implementations would involve an interface to additional tree management and storage logic. The pseudocode (later) addresses the logic utilized by the SHC evaluation cycle in the example embodiment.

It should be noted that in an embodiment, when the final result is produced, the frequency $f_w$ may be omitted, while the $T_w$ element is converted into, or simply reinterpreted as, the equivalent Code Length Distribution form $\{l, c_l\}$. This form maps the bit length to the count, which is implicit by position in the vector $T_w = \{c_{1,w}, c_{2,w}, \ldots, c_{M,w}\}$, as mentioned earlier. In some implementations this may be converted to, e.g., tuples of data $\{\{1, c_1\}, \{2, c_2\}, \ldots, \{M, c_M\}\}$, though the logical meaning is equivalent.

Also important to note is that during SHC operation, as elements are removed specifically from the LQ, the symbols are scheduled for emission to the downstream phase. Depending on implementation, these symbols may be queued separately to await completion of the entire SHC process, which synchronizes emission of the symbol list with the final result. Generally this synchronization semantic is required in some form for functional correctness.

```
// Pseudocode for SHC evaluation logic, assuming A and B have already
been selected, and respective queues adjusted, as previously described
// In referencing fields of A and B, these are the same constituent fields of
the referenced queue entries
// If B does not exist, the value of all of its fields will be considered to be
zero (0)
// New frequency field
f_w = A.f + B.f,
// (One example implementation)
// All counters are of appropriate width to handle the maximum expected
subtree size and
// may be resized as necessary, or optimized to minimum necessary size,
for storage . . .
// Define new counter vector of values for subtree node T_w
//   For this, all vectors are of length M (M > 0) different counters.
//   Notation such as c = {c_1, c_2, . . . , c_M}, represents a vector of
M different counters.
//   Vector addition operator (+') works in the traditional manner:
//     Elements of like position in (same-sized) vector operands are added,
producing a vector of same size
if ((A came from LQ)&&(B exists && came from LQ))     // Combining
two leaves into a subtree, each begin as 1-bit codes (i.e. 2 of them)
        c = {2, 0, . . . , 0};
else if ((A came from LQ)&&(B exists && came from TQ))
// Combining a leaf with a subtree, the new subtree will have
a single 1-bit code
        c = {1,    0,   0, . . . ,    0,       0} +'
        {0, B.c_1, B.c_2, . . . , B.c_{M-2}, (B.c_{M-1} + B.c_M)};    // Note
the M-th element will be a sum of (M-1)-th and M-th
else if ((A came from TQ)&&(B exists && came from TQ))
// Combining two subtrees together, the new subtree will have
no 1-bit codes
```

-continued

```
c = {0, A.c₁, A.c₂, ... , A.c_{M-2}, (A.c_{M-1} + A.c_M)} +'
    {0, B.c₁, B.c₂, ... , B.c_{M-2}, (B.c_{M-1} + B.c_M)};
else if (A came from LQ)        // Only one leaf element will
create a subtree node of one 1-bit code
    c = {1, 0, . . . , 0};
else if (A came from TQ)        // The one remaining TQ
element must be the root tree histogram
    c = {A.c₁, A.c₂, . . . , A.c_{M-2}, A.c_{M-1}, A.c_M};   // No
    change
// Establish T_w
    T_w = c;
    if ((A came from TQ)&&(B does not exist))
    {
        Emit {f_w, T_w} as the final result. This is the root of the
tree.
Done with entire Subtree Histogram Computer operation (until a new
operation is required).
    }
    Else
    {
    TQ_w = {f_w, T_w}; // This is placed at the tail of the TQ
    Done with one Evaluation Cycle. Return to consider when to
begin the next Evaluation Cycle.
```

While the above/below focuses on a binary coding (output) alphabet space of $\{0,1\}$, this invention is not limited to a binary space. An alphabet space of higher order radix R (R>1) may be achieved by generalizing the SHC evaluation cycle to examine the R head-most entries of both the LQ and TQ, to find the best qualifying R entries among the 2R total [note when binary, R=2, so it's all consistent]. The computation and generation of each new subtree element would then involve a generalization of the pseudocode to cover the various combinations of origins of the chosen elements, applying arithmetic appropriately.

In the generalization, for example, in lieu of A and B, there exists an array of selected elements, called $S_i$ ($0<=i<R$), which are evaluated and combined in the same manner. Ultimately a code length distribution or R-ary tree, depending on implementation, may be produced, defining minimally the expected dimensions of the output codes, formed from an alphabet of radix R.

In the generalized form, the final symbol code mapping may be generated in an implementation-dependent manner, e.g., either from a fully built tree, or application of a desired encoding scheme to the code length distribution. Such an encoding scheme may be similar but not identical to what is used in DEFLATE (RFC 1951 3.2.2), with the key exception being a change in radix if R>2. Ultimately, the output codes of radix R effectively encode the input.

Use of higher radix (non-binary) compressed alphabets may find many applications in alternative physical representations of digital logic, e.g. multivalued logic designs, or in forming a logical code for referencing a secondary structure, e.g. an index of strings, etc.

Thus, the techniques herein can serve as a translation from one alphabet to another, constructed of arbitrary radix.

In an embodiment, a method is presented for encoding an input source data set and decoding encrypted versions of the input source data set. The method is implemented as executable instructions residing within and/or programmed within non-transitory computer-readable storage media and/or memory and executed therefrom by one or more processors of a computing device.

In an embodiment, the executable instructions are programmed within firmware of the computing device.

The processing of the method identifies unique prefixes of strings from an input source data set; resolves frequencies for each unique prefix; determines a distribution for each unique prefix string and frequency combination without processing an explicit tree construct; and outputs a symbol table having a plurality of unique symbols mapped to the unique prefixes and the distribution for encoding the input source data set.

In embodiment, the identifying processing further includes assigning a bit string to represent each unique prefix, wherein the bit string is a unique symbol in the symbol table.

In an embodiment of the previous embodiment, the determining processing includes sorting the unique prefixes from a first bit string having a lowest frequency to a last bit string having a highest frequency.

In an embodiment of the previous embodiment, the sorting processing further includes representing each unique symbol according to that symbol's order such that the first bit string's unique symbol has a smallest sized bit string length to the last bit string having a largest sized bit string.

In an embodiment, the determining processing further includes representing the distribution as an array of counters that implicitly define the explicit tree construct.

In an embodiment, the determining processing further includes representing the distribution as a histogram that implicitly defines the explicit tree construct.

In an embodiment, the processing further includes encoding the input source data set by processing the distribution with the symbol table against the input source data set producing a compressed source data set.

In an embodiment of the previous embodiment, the processing further includes decompressing the compressed source data set by processing the distributing with the symbol table against the compressed source data set producing the input source data set.

In an embodiment, the processing further includes processing the steps of the method in place of any prefix encoding scheme.

In an embodiment, the processing further pipelining the steps of the method in a multi-processing architecture of a computing device.

In an embodiment, a non-transitory computer-readable medium having executable instructions residing in and/or programmed within a non-transitory computer-readable medium and/or memory is provided, which when executed by a computing device performs a method. The instructions when execute process to: map codes in a data set to unique symbols producing a map; produce a code distribution of the codes appearing in the data set without utilizing a tree construct; and output the map and the code distributing to compress the data set.

In an embodiment, the medium further includes instructions to compress the data set by processing the map and code distribution against the data set.

In an embodiment of the previous embodiment, the medium further includes instructions to decompress the data set by processing the map and the code distributing against the data set.

In an embodiment, the medium further includes instructions to parallel process the map to produce the distribution.

In an embodiment of the previous embodiment, the medium further includes instructions to concurrently process four pairs of unique symbols and their corresponding codes from the map to produce the distribution.

In an embodiment, the medium further includes to produce a histogram of counters as the distribution that can be processed in place of the tree construct.

In an embodiment, a computing device is presented include multiple processors and an encoder configured to: i)

execute on the processors, ii) produce a symbol table and a distribution from an input source data set without using a tree construct, and iii) output the symbol table and the distribution to encode the source data set and to decode encoded versions of the source data set.

In an embodiment, the processors are configured to parallel process the encoder.

In an embodiment, the computing device further includes an interface to a database that is configured to store the input source data set and interact with the encoder to encode and decode encrypted versions of the source data set.

The diagrams are depicted in greatly simplified form with only those components necessary for understanding embodiments of the invention depicted. It is to be understood that other components may be present without departing from the teachings provided herein.

The above description is illustrative, and not restrictive. Many other embodiments will be apparent to those of skill in the art upon reviewing the above description. The scope of embodiments should therefore be determined with reference to the appended claims, along with the full scope of equivalents to which such claims are entitled.

The invention claimed is:

1. A method, comprising:
    identifying unique prefixes of strings from an input source data set;
    resolving frequencies for each unique prefix;
    determining a distribution for each unique prefix string and frequency combination without processing an explicit tree construct;
    assigning a bit string to represent each unique prefix; and
    outputting a symbol table having a plurality of unique symbols mapped to the unique prefixes and the distribution for encoding the input source data set;
    wherein for each unique prefix, the assigned bit string is the unique symbol in the symbol table.

2. The method of claim 1, wherein determining further includes sorting the unique prefixes from a first bit string having a lowest frequency to a last bit string having a highest frequency.

3. The method of claim 2, wherein sorting further includes representing each unique symbol according to that symbol's order such that the first bit string's unique symbol has a smallest sized bit string length to the last bit string having a largest sized bit string.

4. The method of claim 1, wherein determining further includes representing the distribution as an array of counters that implicitly define the explicit tree construct.

5. The method of claim 1, wherein determining further includes representing the distribution as a histogram that implicitly defines the explicit tree construct.

6. The method of claim 1 further comprising, encoding the input source data set by processing the distribution with the symbol table against the input source data set producing a compressed source data set.

7. The method of claim 6 further comprising, decompressing the compressed source data set by processing the distributing with the symbol table against the compressed source data set producing the input source data set.

8. The method of claim 1 further comprising, processing the method within firmware of a computing device.

9. The method of claim 1 further comprising, processing the method in place of any prefix encoding scheme.

10. The method of claim 1 further comprising, pipelining the steps of the method in a multi-processing architecture of a computing device.

11. A non-transitory computer-readable medium having executable instructions, when executed by a computing device performs a method to:
    map codes in a data set to unique symbols producing a map;
    produce a code distribution of the codes appearing in the data set without utilizing a tree construct;
    output the map and the code distribution to compress the data set; and
    compress the data set by processing the map and code distribution against the data set.

12. The medium of claim 11, further including instructions to decompress the data set by processing the map and the code distributing against the data set.

13. The medium of claim 11, wherein the produce instruction further includes instructions to parallel process the map to produce the distribution.

14. The medium of claim 13, wherein the parallel process instruction further includes instructions to concurrently process four pairs of unique symbols and their corresponding codes from the map to produce the distribution.

15. The medium of claim 11, wherein the produce instruction includes further includes instructions to produce a histogram of counters as the distribution that can be processed in place of the tree construct.

16. A computing device, comprising:
    processors; and
    an encoder configured to: i) execute on the processors, ii) identify unique prefixes of strings from an input source data set, iii) resolve frequencies for each unique prefix, iv) determine a distribution for each unique prefix string and frequency combination without processing an explicit tree construct, v) assign a bit string to represent each unique prefix; and vi) output a symbol table having a plurality of unique symbols mapped to the unique prefixes and the distribution for encoding the input source data set; wherein for each unique prefix, the assigned bit string is the unique symbol in the symbol table.

17. The computing device of the claim 16, wherein the processors are configured to parallel process the encoder.

18. The computing device of the claim 16 further comprising, a database configured to store the input source data set and interact with the encoder to encode and decode the source data set.

* * * * *